(12) United States Patent
Combelles et al.

(10) Patent No.: US 6,192,493 B1
(45) Date of Patent: Feb. 20, 2001

(54) DATA ELEMENT INTERLEAVING/ DEINTERLEAVING

(75) Inventors: Pierre Combelles; Damien Castelain; Denis Callonnec, all of Rennes (FR)

(73) Assignees: France Telecom; Telediffusion de France, both of Paris (FR)

( * ) Notice: Under 35 U.S.C. 154(b), the term of this patent shall be extended for 0 days.

(21) Appl. No.: 09/000,273

(22) PCT Filed: Jul. 18, 1996

(86) PCT No.: PCT/FR96/01135

§ 371 Date: Jan. 27, 1998

§ 102(e) Date: Jan. 27, 1998

(87) PCT Pub. No.: WO97/05702

PCT Pub. Date: Feb. 13, 1997

(30) Foreign Application Priority Data

Jul. 27, 1995 (FR) .................................................. 95 09274

(51) Int. Cl.⁷ .................................................. G06F 11/00
(52) U.S. Cl. .................................................. 714/701
(58) Field of Search .................................................. 714/701

(56) References Cited

U.S. PATENT DOCUMENTS 4,394,642   7/1983   Currie et al. .
5,042,033   8/1991   Costa .
5,742,612 * 4/1998   Gourgue et al. ..................... 714/701
5,745,497 * 4/1998   Ben-Efraim et al. ................. 714/702

FOREIGN PATENT DOCUMENTS 0 627 821 A1   12/1994   (EP) .
2 592 258       6/1987   (FR) .
95/16311        6/1995   (WO) .

OTHER PUBLICATIONS

IBM Technical Disclosure Bulletin, vol. 16, No. 5, Oct. 1973, New York, USA, pp. 1432–1436, Ouchi & Patel: "Random access memory implementation of interlaced error correction codes."

\* cited by examiner

Primary Examiner—Phung M. Chung
(74) Attorney, Agent, or Firm—Lowe Hauptman Gilman & Berner, LLP

(57) ABSTRACT

To interleave or deinterleave data elements in first and second blocks transmitted alternately and each having N data elements with rank n lying between 0 and N−1, N being an integer, the data elements with ranks 0, ... n, ... N−1 in the first blocks are ordered in accordance with the successive ranks $A(0), \ldots A(n), \ldots A(N-1)$ and the data elements with ranks 0, ... n, ... N−1 in the second block are ordered in accordance with the successive ranks $A^{-1}(0), \ldots A^{-1}(n), \ldots A^{-1}(N-1)$. A and $A^{-1}$ are different functions such that $A^{-1}(A(n))=n$.

3 Claims, 4 Drawing Sheets

FIG. 3A

| rank n of $e_{2k,n}$ in block $B_{2k}$ to be written | address n in 51 | rank n of $e_{2k+1,n}$ in block $B_{2k+1}$ to be written | Address A(n) in 52 = rank of $e_{2k,n}$ to be read | rank n of $e_{2k+2,n}$ in block $B_{2k+2}$ to be written | address $A^{-1}(A(n))$ in 51 = rank n of $e_{2k+1}$ to be read |
|---|---|---|---|---|---|
| 0 | 0 | 0 | 0 | 0 | 0 |
| 1 | 1 | 1 | 7 | 1 | 1 |
| 2 | 2 | 2 | 34 | 2 | 2 |
| 3 | 3 | 3 | 31 | 3 | 3 |
| 4 | 4 | 4 | 48 | 4 | 4 |
| 5 | 5 | 5 | 35 | 5 | 5 |
| 6 | 6 | 6 | 42 | 6 | 6 |
| 7 | 7 | 7 | 19 | 7 | 7 |
| 8 | 8 | 8 | 16 | 8 | 8 |
| 9 | 9 | 9 | A(9) = 33 | 9 | $A^{-1}(33) = 9$ |
| 10 | 10 | 10 | 20 | 10 | 10 |
| 11 | 11 | 11 | 27 | 11 | 11 |
| 12 | 12 | 12 | 14 | 12 | 12 |
| 13 | 13 | 13 | 1 | 13 | 13 |
| 14 | 14 | 14 | 18 | 14 | 14 |
| 15 | 15 | 15 | 5 | 15 | 15 |
| 16 | 16 | 16 | 12 | 16 | 16 |
| 17 | 17 | 17 | 39 | 17 | 17 |
| 18 | 18 | 18 | 36 | 18 | 18 |
| 19 | 19 | 19 | 3 | 19 | 19 |
| 20 | 20 | 20 | 40 | 20 | 20 |
| 21 | 21 | 21 | 47 | 21 | 21 |
| 22 | 22 | 22 | 24 | 22 | 22 |
| 23 | 23 | 23 | 21 | 23 | 23 |
| 24 | 24 | 24 | 38 | 24 | 24 |

FIG. 3B

| rank n of $e_{2k,n}$ in block $B_{2k}$ to be written | address n in 51 | rank n of $e_{2k+1,n}$ in block $B_{2k+1}$ to be written | Address $A(n)$ in 52 = rank of $e_{2k,n}$ to be read | rank n of $e_{2k+2,n}$ in block $B_{2k+2}$ to be written | address $A^{-1}(A(n))$ in 51 = rank n of $e_{2k+1}$ to be read |
|---|---|---|---|---|---|
| 25 | 25 | 25 | 25 | 25 | 25 |
| 26 | 26 | 26 | 32 | 26 | 26 |
| 27 | 27 | 27 | 9 | 27 | $A^{-1}(9) = 27$ |
| 28 | 28 | 28 | 6 | 28 | 28 |
| 29 | 29 | 29 | 23 | 29 | 29 |
| 30 | 30 | 30 | 10 | 30 | 30 |
| 31 | 31 | 31 | 17 | 31 | 31 |
| 32 | 32 | 32 | 44 | 32 | 32 |
| 33 | 33 | 33 | 41 | 33 | 33 |
| 34 | 34 | 34 | 8 | 34 | 34 |
| 35 | 35 | 35 | 45 | 35 | 35 |
| 36 | 36 | 36 | 2 | 36 | 36 |
| 37 | 37 | 37 | 29 | 37 | 37 |
| 38 | 38 | 38 | 26 | 38 | 38 |
| 39 | 39 | 39 | 43 | 39 | 39 |
| 40 | 40 | 40 | 30 | 40 | 40 |
| 41 | 41 | 41 | 37 | 41 | 41 |
| 42 | 42 | 42 | 14 | 42 | 42 |
| 43 | 43 | 43 | 11 | 43 | 43 |
| 44 | 44 | 44 | 28 | 44 | 44 |
| 45 | 45 | 45 | 15 | 45 | 45 |
| 46 | 46 | 46 | 22 | 46 | 46 |
| 47 | 47 | 47 | 49 | 47 | 47 |
| 48 | 48 | 48 | 46 | 48 | 48 |
| 49 | 49 | 49 | $A(49) = 13$ | 49 | 49 |

DATA ELEMENT INTERLEAVING/ DEINTERLEAVING

BACKGROUND OF THE INVENTION

1. Field of the Invention

The present invention concerns the interleaving and deinterleaving of data elements in consecutive data blocks of a digital signal.

The data elements can be binary elements or symbols, or groups of bits such as words occupying time slots in a frame of a time-division or frequency-division multiplex signal. The blocks can be protocol data units, for example, such as packets or frames, or data fields in packets or frames, or lines or fields of a digital television signal. To give one more example, a block can comprise PQ bits divided into P groups each of Q bits frequency-division multiplexed onto P respective carriers.

2. Description of the Prior Art

In an emitter, interleaving consists in ordering the elements in each block in a manner differing from the initial order of the elements so that initially consecutive data elements are separated by a relatively large number of other data elements in the block of interleaved elements to be emitted. Thus interleaving contributes to at least partial alleviation of the phenomenon of fading on a transmission path between the emitter and a receiver by introducing time-domain or frequency-domain diversity into the digital signal. In practice the data elements for forming blocks of interleaved elements are interleaved in an interleaver connected for example to the output of an error correcting encoder, also known as a channel encoder, and to the input of a modulator. Conversely, the initial digital signal is reconstituted in the receiver by deinterleaving interleaved elements in each block using a deinterleaver for example connected between a demodulator and a channel decoder.

In one implementation known in itself interleaving consists in writing the data elements of each block in their natural order of arrival into a memory circuit and then reading the data elements of the block in accordance with a predetermined interleaving function.

The memory circuit comprises two RAM memories arranged in parallel and each containing N data element cells. The integer N denotes the number of data elements in each block. One of the memories is being written while the other memory is being read in one block period in two, and vice versa in the next block period. If n varying from 0 through N−1 denotes the rank of a data element in an incoming block and t denotes the duration of a data element, the data elements $e_0, \ldots e_n, \ldots e_{N-1}$ of a first incoming block $BE_0$ of duration Nt are written successively at times 0, . . . nt, . . . (N−1)t into the cells of a first of the memories having addresses 0, . . . n, . . . N−1. Then, during the next block period [Nt, (2Nt−1)) t], the data elements of a second incoming block $BE_1$ are written into the cells of the second memory while the data elements of the first preceding block $BE_0$ are read in the first memory using read addresses P(0), . . . P(n), . . . P(N−1). P denotes the predetermined interleaving function which establishes a biunivocal correspondence between a write address n and a read address P(n). After all the elements of the first block have been read in their entirety in the first memory, the second memory is read using the address function P(n) to interleave the data elements of the second block. Thus the blocks with an even rank are read and written in the first memory and the blocks with an odd rank are read and written in the second memory.

To reduce the cost of interleaving, consideration can be given to using only a single memory of size N having an incoming data bus for the incoming blocks of elements and an outgoing data bus for the interleaved elements of the outgoing blocks. If W(nt) and R(nt) denote the write and read addresses at time nt of a block period, in each unit time period nt it is necessary to read a data element of a previously written block and to write a data element of a subsequent block in the same cell. In other words, it is necessary to satisfy the equation W(nt)=R(nt).

Assuming that the memory is emptied in order to write into it a first incoming block $B_0$, the elements $e_{0,0}$ to $e_0$, (N−1) of the block $B_0$ are written successively into the cells with addresses $R_0(0t)=0$ through $R_0((N-1)t)=N-1$. In the second following block period, in the cells with addresses $R_1(0t)=P(0)$ through $R_1((N-1)t)=P(N-1)$, the interleaved elements of the first block $B_0$ are read successively in accordance with the interleaving function P, and the elements $e_{1,0}$ through $e_1$, (N−1) of the next block $B_1$ are written successively. Thus the read address $R_1(nt)$ at time nt in the second block period is equal to the write address $W_0(P(n)$ t)=P(n). More generally, for the block of rank k the following recurrence equation must be satisfied:

$$R_k(nt)=W_{k-1}(P(n)t),$$

i.e., $R_k(nt)=R_{k-1}(P(n)t)$.

Knowing that $R_0(nt)=n$, then $R_1(nt)=P(n), \ldots$ thus $R_k(nt)= P^k(n)$.

Accordingly the element of rank P(n) of the block $B_{k-1}$ that was written at time P(n)t of the period for writing block $B_{k-1}$ is read at time nt of the period for writing the next block $B_k$ and has the rank n in the interleaved block. This time correspondence is equivalent to that between the reading of the element $e_n$ of one block in one of the two memories at time P(n)t and the writing of the element $e_n$ at time nt during the previous block period, as in the known implementation.

To apply the interleaving function P to each block write/read period, a series of addresses must be produced that is different from one write/read period to the next. If k increases and N is large, it is very difficult to produce all the series of addresses.

Nevertheless, for particular interleaving functions, an addressing cycle appears. After q block write/read periods, the initial series of addresses 0 through N−1 recurs:

$$R_q(nt)=W_q(nt)=n$$

In other words, the minimal integer q satisfying the equation $P^q(n)=n$ is relatively small.

For example, an interleaving function of the type $$P(n)=(a.(n+1)+b)[\text{modulo } N]$$

defined in patent application FR-A-2706054 satisfies this objective. For example, if n varies from 0 to N−1=16, a=4 and b=0, with reference to FIG. 2 of the aforementioned patent application, q=4 series of addresses are needed to find again to the initial series of addresses 0 through 16, as shown in the following table:

| n | P(n) | $P^2(n)$ | $P^3(n)$ | $P^4(n) = n$ |
|---|------|----------|----------|--------------|
| 0 | 4    | 3        | 16       | 0            |
| 1 | 8    | 2        | 12       | 1            |
| 2 | 12   | 1        | 8        | 2            |
| 3 | 16   | 0        | 4        | 3            |
| 4 | 3    | 16       | 0        | 4            |

-continued

| n  | P(n) | P²(n) | P³(n) | P⁴(n) = n |
|----|------|-------|-------|-----------|
| 5  | 7    | 15    | 13    | 5         |
| 6  | 11   | 14    | 9     | 6         |
| 7  | 15   | 13    | 5     | 7         |
| 8  | 2    | 12    | 1     | 8         |
| 9  | 6    | 11    | 14    | 9         |
| 10 | 10   | 10    | 10    | 10        |
| 11 | 14   | 9     | 6     | 11        |
| 12 | 1    | 8     | 2     | 12        |
| 13 | 5    | 7     | 15    | 13        |
| 14 | 9    | 6     | 11    | 14        |
| 15 | 13   | 5     | 7     | 15        |
| 16 | 0    | 4     | 3     | 16        |

OBJECT OF THE INVENTION

The present invention aims to reduce the addressing cycle inherent to the use of a single memory for interleaving data elements block by block and consequently to reduce the complexity of the means needed to produce the memory addresses. The equation $P^q(n)=n$, that is to say $P^4(n)=n$ from the above table, imposes a high constraint on the function P.

SUMMARY OF THE INVENTION

Accordingly, a method of modifying the order, i.e. interleaving (or deinterleaving), of data elements in first and second blocks transmitted alternately and each having N data elements with ranks n lying between 0 and N−1, N being an integer, is characterized in that the data elements with ranks 0, . . . n, . . . N−1 in the first blocks are ordered in accordance with the successive ranks A(0), A(n), . . . A(N−1) and the data elements with numbers 0, . . . n, . . . N−1 in the second blocks are ordered in accordance with the successive ranks $A^{-1}(0), \ldots A^{-1}(n), \ldots A^{-1}(N)$, A and $A^{-1}$ being different first and second functions such that $A^{-1}(A(n))=n$.

In practice, the following operations are performed in a memory having N data element cells with addresses 0 through N−1 and relating to a first block, a second next block and a first next block:

a)—reading elements of the first block ordered in accordance with the first function A and simultaneously writing elements of the second next block in the memory so that an element with a rank A(n) in the first block is read in a cell having the address A(n) and an element with the rank n in the second next block is written in the cell having the address A(n), and b)—reading elements of the second next block ordered in accordance with the second function $A^{-1}$ and simultaneously writing elements of the first next block in the memory so that an element with the rank $A^{-1}(n)$ in the second next block is read in a cell having the address n and an element with the rank n in the first next block is written in the cell having the address n.

According to a variant, the memory is replaced by first and second memories which are addressed in write mode and in read mode alternately at the timing rate of the data elements in order to write and read therein the data elements respectively having even and odd ranks in each of the blocks. In this case, the integer N is even and the integers A(n) and n have the same parity, and the write address of an element of rank n is equal to the read address of the element with the preceding rank (n−1).

BRIEF DESCRIPTION OF THE DRAWINGS

Other features and advantages of the present invention will be apparent more clearly from the reading of the following description of several embodiments of the invention with reference to the corresponding accompanying drawings in which:

FIGS. 3A and 3B are a table of addresses of the data element memory included in the interleaver, relating to three consecutive data element blocks;

DESCRIPTION OF THE PREFERRED EMBODIMENTS

Figure 1:
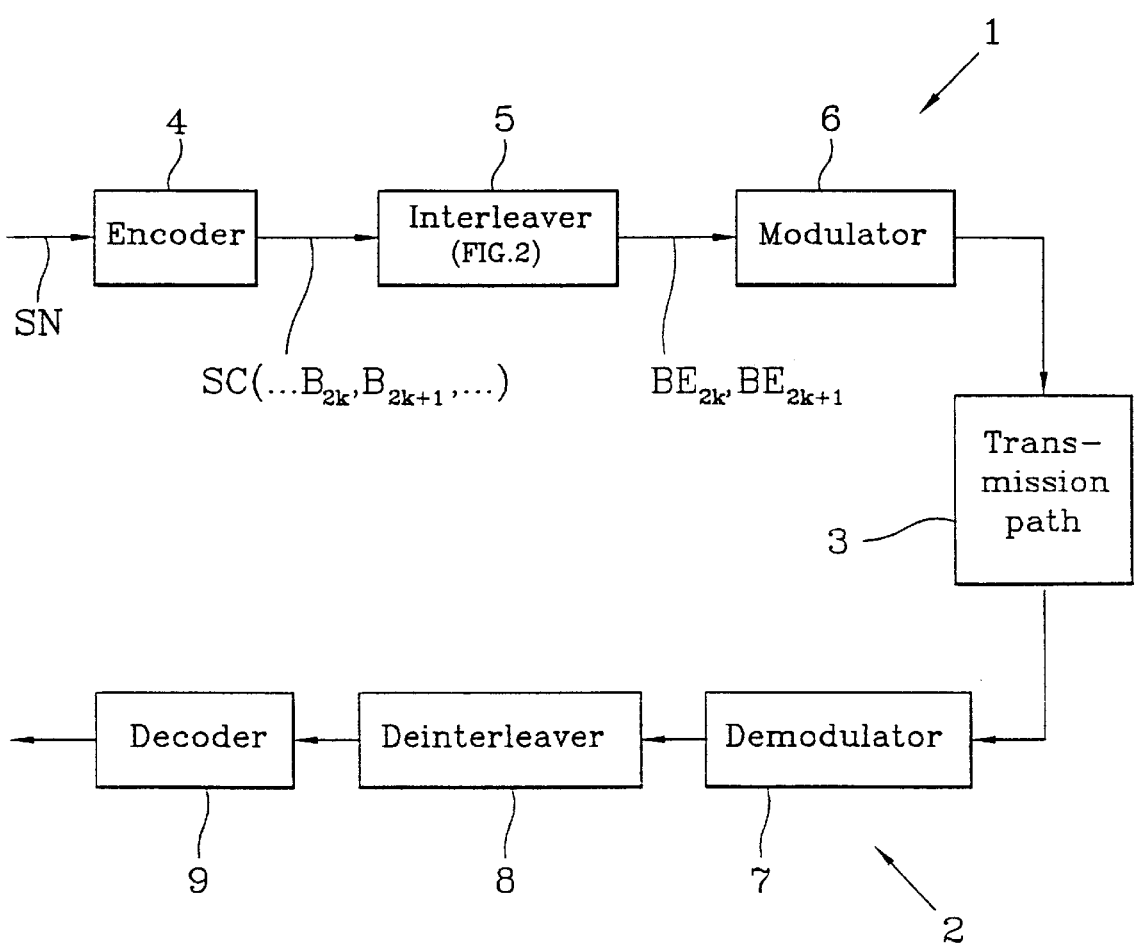
FIG. 1 is a block diagram of a transmission system in which the emitter and the receiver respectively include an interleaver and a deinterleaver implementing the method of the invention.

Referring to FIG. 1, a transmission system comprises an emitter 1 and a receiver 2 connected by a transmission path 3, for example a radio channel.

The emitter 1 includes an encoder 4 receiving a digital signal SN, an interleaver 5 and a modulator 6. The encoder 4 carries out block error correction linear encoding, for example of the Reed-Solomon type, to produce an encoded digital signal SC. The signal SC is made up of information and control symbols forming blocks . . . $B_{2k}$, $B_{2k+1}$, . . . each having a predetermined number N of data elements . . . [$e_{2k,0}$ through $e_{2k,N-1}$], [$e_{2k+1,0}$ through $e_{2k+1,N-1}$]. . . In this instance the data elements are bits. Linear error correction encoding can correct isolated and intermittent errors that can arise even if the transmission path 3 is subject to low levels of interference.

The interleaver 5 interleaves the data elements in the blocks $B_{2k}$, $B_{2k+1}$ in accordance with the interleaving method of the invention. Interleaving prior to transmission of the digital signal separates initially consecutive data elements by a relatively large number of other data elements in a block so that any interference, such as fading, on the transmission path 3 affects only one or a few consecutive elements. This precaution facilitates reconstitution of the initial digital signal in the receiver 2 since a data element subject to interference is necessarily between data elements not subject to interference in the digital signal SN.

The interleaver 5 produces blocks of interleaved elements $BE_{2k}$, $BE_{2k+1}$ constituting an interleaved flux which is converted into a modulated signal in the modulator 6 using any form of digital modulation.

The receiver 2 executes functions which are the converse of those of the emitter 1. To this end the receiver 2 includes in succession a demodulator 7, a deinterleaver 8 for deinterleaving the interleaved elements of the blocks $BE_{2k}$, $BE_{2k+1}$ leaving the demodulator into blocks $B_{2k}$, $B_{2k+1}$, and a decoder 9 carrying out symbol block linear decoding of the same type as the encoding carried out in the encoder 4. In particular, the deinterleaver 8 deinterleaves received data elements in accordance with a deinterleaving function in accordance with the invention.

Hereinafter, the term "interleaver" and corresponding related terms can be replaced by the term "deinterleaver" and the corresponding related terms because the interleaver and the deinterleaver perform the same functions. Although the subject matter of this patent application concerns an interleaving method, it also concerns a deinterleaving method.

Figure 2:
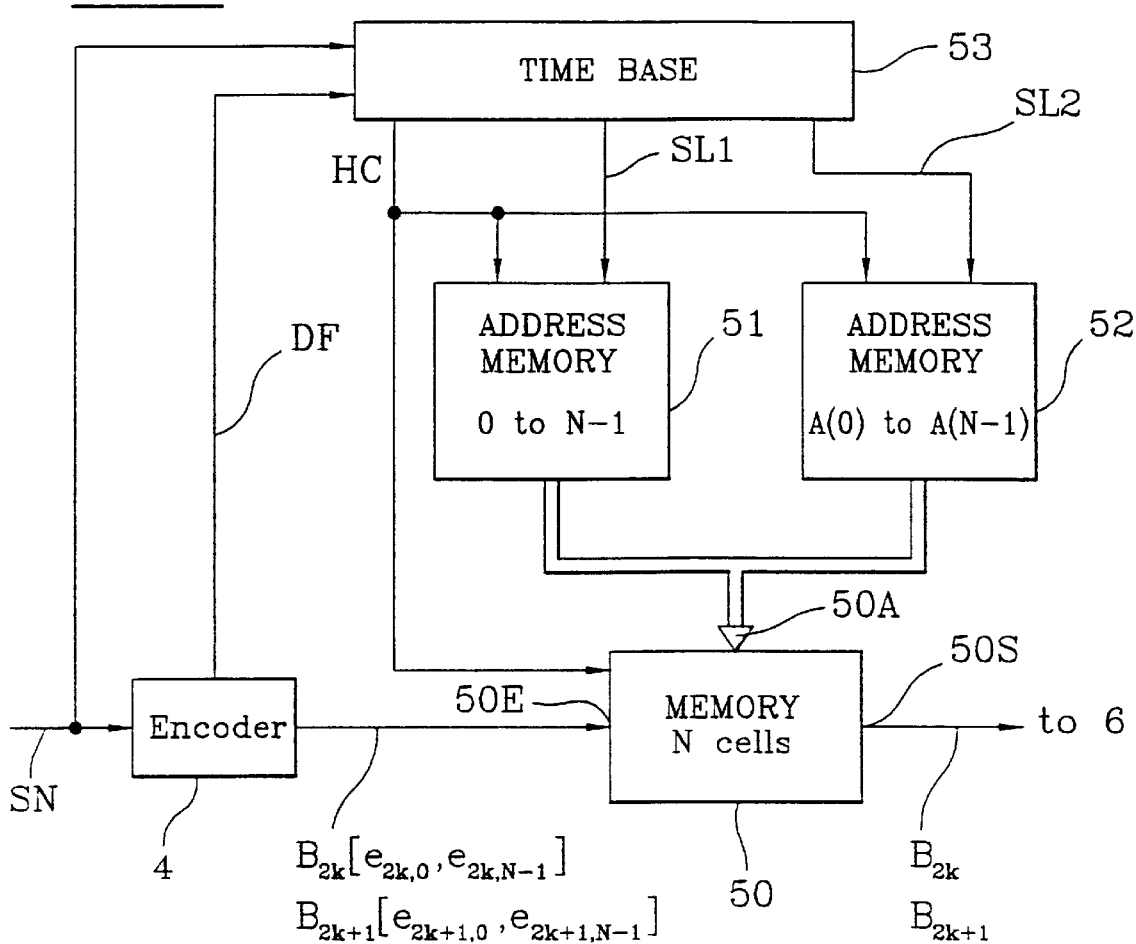
FIG. 2 is a block diagram of the interleaver according a first embodiment.

In a first embodiment shown in FIG. 2, the interleaver 5 includes a single RAM memory 50 having N cells. Each cell is capable of storing one data element. The memory 50 has two data ports 50E and 50S. The input port 50E receives the initial blocks $B_{2k}$, $B_{2k+1}$ from the encoder 4 element by element. The output port 50S applies the outgoing blocks of interleaved elements $BE_{2k}$, $BE_{2k+1}$ to the modulator 6 element by element. If the data elements each comprise several bits, the ports 50E and 50S are an input bus connecting a series-to-parallel converter to the memory and an output bus connecting the memory to a parallel-to-series converter.

In accordance with the invention, an interleaving function A having particular properties for transmission on the transmission path 3 is applied to alternate blocks produced by the encoder 4. For example, the function A is applied to first blocks $B_0, \ldots B_{2k}, B_{2k+2}, \ldots$ with even ranks where k is an integer. For example, block $B_{2k}$ comprises N data elements $e_{2k,0}, \ldots e_{2k,n}, \ldots e_{2k,N-1}$ where a is an integer lying between 0 and N−1.

If the elements $e_{2k,0}$ through $e_{2k,N-1}$ of the first block $B_{2k}$ are applied consecutively to the memory 50 via the input port 50E, a first address PROM memory 51 applies successively read/write addresses $RW_{2k}(0)=0$ through $RW_{2k}((N-1)t)=N-1$. Each period of a control clock HC produced by a time base 53 synchronized to the bit clock of the initial digital signal SN is divided into two parts. For the element $e_{2k,n}$ for example, during the first clock period part a data element of the preceding block $B_{2k-1}$ written into the cell at the address $RW_{2k}(nt)=n$ is read. During the second part of the clock period, the data element $e_{2k,n}$ of the block $B_{2k}$ is written in the cell having the address n, i.e. at time nt counting from the start of the block $B_{2k}$.

In the next block period the second block $B_{2k+1}$ is presented to the input port 50E. At the time nt counting from the start of the next block period, a second address PROM memory 52 applies the read/write address $RW_{2k+1}(nt)=A(n)$. During the first part of the corresponding period of the clock signal HC, the data element $e_{2k,A}(n)$ of the block $B_{2k}$ is read in the cell having the address A(n) During the second part of the corresponding clock period, the data element $e_{2k+1,n}$ of the second block $B_{2k+1}$ is written into the cell having the address A(n). Thus the data elements of the first block $B_{2k}$ are interleaved in accordance with the function A(n).

During the next block period, the first next block $B_{2k+2}$ is then processed in the same manner as the block $B_{2k}$ in the memory 50. The read/write addresses $RW_{2k+2}(nt)=n$ are produced by the first address memory 51 for successively reading/writing the N cells of the memory 50 in the natural order of the addresses 0 through N−1. During first clock period parts corresponding to the writing of the elements $e_{2k+2,0}$ through $e_{2k+2,N-1}$ of the block $B_{2k+2}$, the elements of the preceding block $B_{2k+1}$ written in accordance with the interleaving function A(n) are read sequentially in accordance with another interleaving function $A^{-1}$ such that $A^{-1}(A(n))=n$, whatever the value of the integer n between 0 and N−1.

FIGS. 3A and 3B show three columns of read/write addresses applied to the memories 51, 52, 51 during three successive block periods during which the first block $B_{2k}$, the second block $B_{2k+1}$ and the first next block $B_{2k+2}$ are applied to the input memory port 50E. The read/write addresses and the ranks of the data elements to read and to write are indicated for each of the periods.

For example, the values for n indicated in FIGS. 3A and 3B correspond to the following interleaving function:

$A(n+1)=a.A(n)+b$ [modulo N], where n=0, . . . N−1.

This function can also be written directly as a function of n $$A(n) = b\sum_{i=1}^{i=n} a^{i-1} \quad [\text{modulo } N]$$

i.e., $A(n)=b(1-a_n)/(1-a)$ [modulo N]
with a=11, b=7 and N=50.

For example, at time nt=9t during three successive block periods, the element $e_{2k-1,27}$ of the block $BE_{2k-1}$ is read and the element $e_{2k,9}$ is written into the cell with address 9, then the element $e_{2k,33}$ of the block $BE_{2k}$ is read and the element $e_{2k+1,9}$ of the block $B_{2k+1}$ is written into the cell with address 33, and then the element $e_{2k+1,27}$ of the block $BE_{2k+1}$ is read and the element $e_{2k+2,9}$ of the block $B_{2k+2}$ is written in the cell with address 9, such that $A^{-1}(A(9))=A^{-1}(33)=9$ and $A^{-1}(9)=27$.

In another example, a cell with address n=6 transmits the elements with rank 28, such as $e_{2k-1,28}$, $e_{2k+1,28}$ of the second blocks $B_{2k-1}, B_{2k+1}$ and receives the elements with rank 6, such as $e_{2k,6}$, $e_{2k+2,6}$ of the first blocks $B_{2k}$, $B_{2k+2}$ during the read/write clock period of rank n=6 during the first block periods. The cell with address n=6 transmits the elements with rank 6, such as $e_{2k,6}$, $e_{2k+2,6}$ of the first blocks $B_{2k}$, $B_{2k+2}$ and receives the elements with rank 28, such as $e_{2k-1,28}$, $e_{2k+1,28}$ during the read/write clock period of rank 28 during second block periods alternating with the first block periods.

In practise, the interleaver 5 shown in FIG. 2 includes a time base 53 which receives the digital signal SN to be encoded and transmitted and start/end-of-block information DF from the encoder 4. The time-base includes frequency counters and dividers for producing the read/write control clock signal HC synchronized to the bit clock at the output of the encoder 4, a first read signal SL1 during the first block periods for reading the addresses 0 through N−1 in the first address memory 51 and applying them to an addressing input 50A of the memory 50, and a second read signal SL2 during the second block periods for reading the addresses A(0) through A(N−1) in the second address memory 52 and applying them to the addressing input 50A of the memory 50.

In a variant, the first memory 51 can be replaced by a modulo-N counter for addressing the memory 50 during the first block periods and for addressing the memory 52 during the second block periods.

The deinterleaver 8 in the receiver 2 also includes RAM memory with N cells, two address PROM memories and time base arranged in the same manner as in the interleaver shown in FIG. 2. Deinterleaving the blocks uses the same interleaving functions A and $A^{-1}$, but interchanged relative to the blocks. Thus the first blocks $BE_{2k}$, $BE_{2k+2}$ of interleaved elements are deinterleaved to produce blocks $B_{2k}$, $B_{2k+2}$ in accordance with the function $A^{-1}$ and the second blocks $BE_{2k-1}$, $BE_{2k+1}$ of interleaved elements are deinterleaved to produce blocks $B_{2k-1}, B_{2k+1}$ in accordance with the function A. As can be seen in FIG. 3, all that is required is to read the table from right to left with an offset of one block.

In a different embodiment, the memory with two data ports 50E and 50S can be replaced by a memory of single data port type having N data element cells.

If a single data port is used, at time nt it is first necessary to read the data element of the current block $BE_K$ having the rank n−1, and then to write the data element of the preceding block $B_{K-1}$ stored in the cell of rank n,
i.e. $R_K(n-1)=W_K(n)$ if $n \neq 0$.

If n=0, the previous equation is written $R_{K-1}(N-1)=W_K(0)$ since at time 0 of the current block $B_K$ it is necessary to read the last data element of the preceding block $BE_{K-1}$ before writing the first data element of the next block. Because of the temporal offset of the read addressing cycle, in storing in memory from one block to the next, the last read address of the first block and the first read address of the next block must be different, to avoid reading the first element of the next block immediately after it is written, i.e.

$$R_{K-1}(N-1)=W_K(0) \neq R_K(0)$$

This condition translates as follows:
1) $R_{2k-1}(N-1) \neq R_{2k}(0)$ if K=2k, i.e. if the block $B_K=B_{2k}$ is a first block with even rank, i.e. $A(N-1) \neq 0$; and
2) $R_{2k}(N-1) \neq R_{2k+1}(0)$ if K=2k+1, i.e. if the block $B_K=B_{2k+1}$ is a second block with odd rank, i.e. $N-1 \neq A(0)$.

The previous two conditions can be satisfied if A(n) and n have the same parity, i.e. A(n) [modulo 2]=n [modulo 2].

Figure 4:
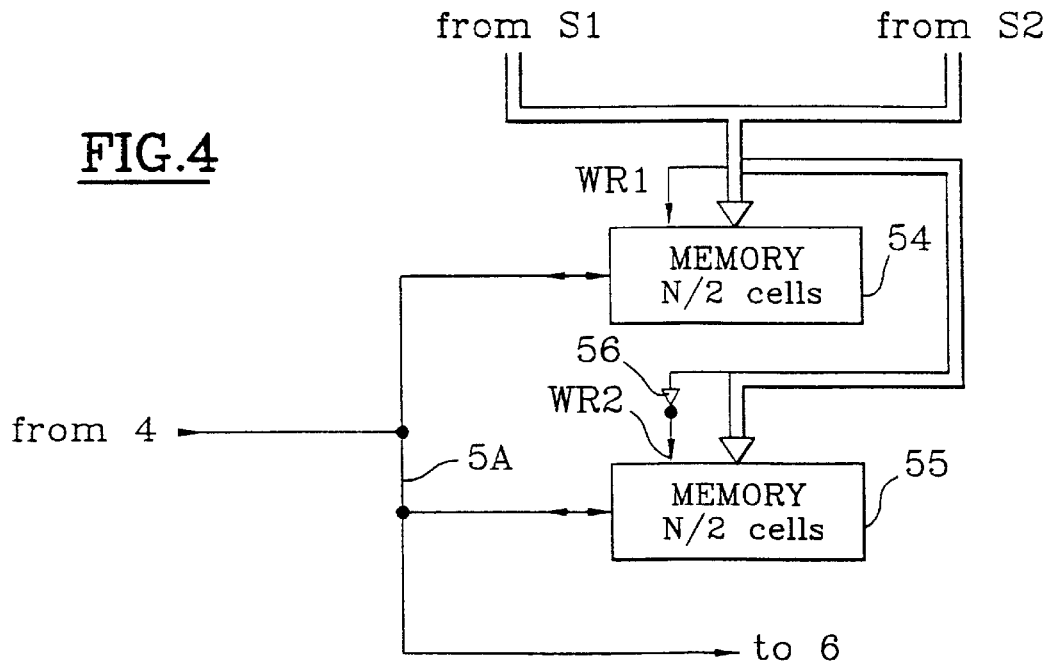
FIG. 4 is a partial block diagram of the interleaver according a second embodiment.

As shown in the FIG. 4, the memory 50 is then replaced by two RAM memories 54 and 55 having a capacity of N/2 cells, where N is even. The memories have a common single data port 5A connected to the output of the encoder 4 and to the input of the modulator 6. When one of the memories 54 and 55 is addressed in write mode, the other memory is addressed in read mode in order to satisfy the equation given below.

$R_K(n-1)=W_K(n)$ at time nt of each block, with $R_K(n-1)=n-1$ if K=2k, and $R_K(n-1)=A(n-1)$ if K=2k+1.

In this second embodiment, the least significant bit 60 in the addresses read in the address memories 51 and 52 is applied directly and via an inverter 56 to read/write authorization inputs WR1 and WR2 of the memories 54 and 55 to command the write/read alternation of the two memories.

To give a practical example, the following interleaving functions can be chosen for this second embodiment:

$A(n)=4740\ n^2+1623\ n+2526$ [modulo 12640] with $0 \leq n < 12640 = N$, and $A^{-1}(n)=4740\ n^2+4887\ n+11038$ [modulo 12640].

What we claim is:

1. A method of modifying the order of data elements in first and second blocks transmitted alternately and each having N data elements with rank n lying between 0 and N−1, N being an integer, the method comprising ordering the data elements with ranks 0, . . . n, . . . N−1 in the first blocks in accordance with the successive ranks A(0), . . . A(n), . . . A(N−1) and ordering the data elements with ranks 0, . . . n, . . . N−1 in the second blocks in accordance with the successive numbers $A^{-1}(0)$, . . . $A^{-1}(n)$, . . . $A^{-1}(N-1)$, where A and $A^{-1}$ are different first and second functions such that $A^{-1}(A(n))=n$.

2. The method of claim 1 wherein the following steps are performed in a memory having N data element cells with addresses 0 through N−1 and relating to a first block, a second next block and a first next block:
   a) reading elements of the first block ordered in accordance with the first function A and simultaneously writing elements of the second next block in the memory so that an element with a rank A(n) in the first block is read in a cell having the address A(n) and an element with the rank n in the second next block is written in the cell having the address A(n), and
   b) reading elements of the second next block ordered in accordance with the second function $A^{-1}$ and simultaneously writing elements of the first next block ($B_{2k+2}$) in the memory so that an element with the rank $A^{-1}(n)$ in the second next block is read in a cell having the address n and an element with the rank n in the first next block is written in the cell having the address n.

3. The method of claim 2 wherein the integer N is even, the integers A(n) and n have the same parity, and replacing the memory by first and second memories, alternately addressing the first and second memories in write mode and in read mode at the timing rate of the data elements so the data elements respectively having even and odd ranks are written and read in the first and second memories in each of the blocks.

* * * * *